United States Patent
Yeo et al.

(10) Patent No.: US 10,879,117 B2
(45) Date of Patent: Dec. 29, 2020

(54) REPLACEMENT CONTACTS

(71) Applicant: Taiwan Semiconductor Manufacturing Co., Ltd., Hsinchu (TW)

(72) Inventors: Yee-Chia Yeo, Hsinchu (TW); Teng-Chun Tsai, Hsinchu (TW); Yasutoshi Okuno, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 16 days.

(21) Appl. No.: 16/378,162

(22) Filed: Apr. 8, 2019

(65) Prior Publication Data

US 2019/0237364 A1     Aug. 1, 2019

Related U.S. Application Data

(62) Division of application No. 15/461,216, filed on Mar. 16, 2017, now Pat. No. 10,256,143.

(60) Provisional application No. 62/434,097, filed on Dec. 14, 2016.

(51) Int. Cl.
| | |
|---|---|
| *H01L 23/528* | (2006.01) |
| *H01L 21/768* | (2006.01) |
| *H01L 23/522* | (2006.01) |
| *H01L 21/306* | (2006.01) |
| *H01L 21/3065* | (2006.01) |
| *H01L 21/308* | (2006.01) |

(52) U.S. Cl.
CPC .... *H01L 21/76879* (2013.01); *H01L 21/3065* (2013.01); *H01L 21/3088* (2013.01); *H01L 21/30604* (2013.01); *H01L 21/76831* (2013.01); *H01L 21/76897* (2013.01); *H01L 23/5226* (2013.01); *H01L 2221/1063* (2013.01)

(58) Field of Classification Search
CPC .................. H01L 23/528; H01L 21/30604
USPC .............................................. 257/43; 438/85
See application file for complete search history.

(56) References Cited

U.S. PATENT DOCUMENTS

| | | | | |
|---|---|---|---|---|
| 6,660,598 B2* | 12/2003 | Hanafi | .............. | H01L 29/66545 257/E21.415 |
| 9,660,057 B2* | 5/2017 | Liu | ................... | H01L 29/66795 |
| 2003/0104706 A1* | 6/2003 | Mitsuhashi | ....... | H01L 21/28185 438/756 |
| 2005/0272191 A1* | 12/2005 | Shah | .............. | H01L 21/823842 438/197 |
| 2009/0001480 A1* | 1/2009 | Cheng | ................... | H01L 29/517 257/387 |

(Continued)

*Primary Examiner* — Jami Valentine Miller
(74) *Attorney, Agent, or Firm* — Sterne, Kessler, Goldstein & Fox P.L.L.C.

(57) ABSTRACT

The present disclosure describes a method of forming a replacement contact. For example, the replacement contact can include a metal with one or more first sidewall surfaces and a top surface. A first dielectric can be formed to abut the one or more first sidewall surfaces of the metal. A second dielectric can be formed over the first dielectric and the top surface of the metal. An opening in the second dielectric can be formed. A metal oxide structure can be selectively grown on the top surface of the metal, where the metal oxide structure has one or more second sidewall surfaces. One or more spacers can be formed to abut the one or more second sidewall surfaces of the metal oxide structure. Further, the metal oxide structure can be removed.

20 Claims, 10 Drawing Sheets

(56) References Cited

U.S. PATENT DOCUMENTS

| | | | |
|---|---|---|---|
| 2012/0104509 A1* | 5/2012 | Matsumoto | H01L 21/28097 257/369 |
| 2012/0205728 A1* | 8/2012 | Yin | H01L 29/66545 257/288 |
| 2013/0178052 A1* | 7/2013 | Fan | H01L 29/4908 438/586 |
| 2016/0126336 A1* | 5/2016 | Wu | H01L 29/42356 257/407 |
| 2017/0033217 A1* | 2/2017 | Hong | H01L 29/7848 |
| 2019/0237364 A1* | 8/2019 | Yeo | H01L 21/30604 |

\* cited by examiner

REPLACEMENT CONTACTS

CROSS-REFERENCE TO RELATED APPLICATION

This application is a divisional of U.S. Non-Provisional patent application Ser. No. 15/461,216, filed on Mar. 16, 2017 and titled "Replacement Contacts," which claims priority to U.S. Provisional Application No. 62/434,097, filed on Dec. 14, 2016, titled "Replacement Contacts," each of which is incorporated herein by reference in its entirety.

BACKGROUND

Metal lines with reduced critical dimensions (CDs) and designs with tight pitches (e.g., high density patterns) impose tight alignment requirements to photolithography operations and increase the risk of photolithography overlay errors during chip fabrication. The photolithography overlay errors can result in contact-to-contact misalignment. Such misalignment can compromise the electrical characteristics and performance of the chip.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

DETAILED DESCRIPTION

Figure 1:
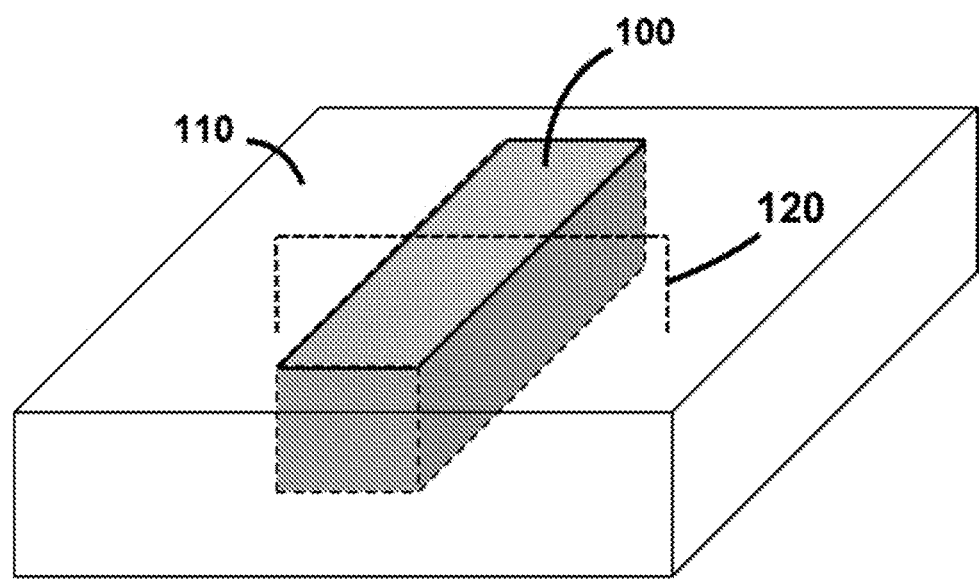
FIG. 1 is an isometric view of a metal region surrounded laterally by a dielectric layer, according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances. Unless defined otherwise, all technical and scientific terms used herein have the same meanings as commonly understood by one of ordinary skill in the art to which this disclosure belongs.

A chip can include multiple layers formed on top of each other. The layers can be electrically connected to one another using one or more vertical metal lines. The one or more vertical metal lines are embedded in a dielectric material and are known as "contacts" or "vertical interconnect access lines" (vias). The contacts are part of an interconnect network that electrically connects various elements in the chip. To ensure electrical continuity and reduce the electrical resistance between layers, a contact in one layer is aligned to a contact in another layer. Contact alignment can be achieved by a photolithography overlay process referred to as "alignment."

Chip fabrication requires precise alignment between the pattern on the photomask and the existing features on the wafer surface. This quality measure is known as "overlay (OVL) accuracy." Alignment is critical because the photomask pattern must be precisely transferred to the wafer from layer to layer. Since multiple photolithography steps are used during patterning, any OVL misalignment is additive and contributes to the total placement tolerances between the different features on the wafer surface. This condition is known as the "OVL budget." High density patterns impose tight alignment requirements to photolithography operations. Since the OVL misalignments are additive, they can adversely affect the total OVL budget.

Since the pattern density increases from node to node, the photolithography overlay process can be challenging. For example, as critical dimensions (CDs) of contacts become smaller (e.g., in the nanometer scale), the misalignment tolerances tighten and the photolithography overlay process becomes increasingly complex. Contact misalignment and a discontinuity between contacts increase the contact resistance between layers—thus degrading the chip's electrical performance. Self-aligned interconnects can provide a relief to the photolithography alignment requirements and effectively increase the alignment, or OVL, window. This is helpful for high density areas of the chip where the line pitch is small and alignment is challenging.

Embodiments of the present disclosure address, among other things, contact misalignment and discontinuities between contacts. In some embodiments, self-aligned contacts can be implemented to provide additional margin to the photolithography overlay process. In some embodiments, the additional overlay margin can be derived from the formation of a larger contact opening positioned above a sacrificial, or replaceable, metal oxide structure which is self-aligned to a smaller underlying metal contact.

For example, a contact opening will expose a portion of an underlying metal contact and its adjacent dielectric layer. The contact opening is defined by photolithography and can be configured to be larger than the underlying metal contact.

A sacrificial metal oxide is formed selectively on the top surface of the underlying metal contact. The sacrificial metal oxide forms a pillar-like structure that grows from bottom-up with substantially vertical sidewalls. Therefore, the width of the underlying metal contact can control the width of the metal oxide sacrificial pillar-like structure.

Since the metal oxide selectively forms on the exposed metal of the underlying contact, and the contact opening mentioned earlier is allowed to be larger than the underlying metal contact width. As such the sacrificial metal oxide structure cannot completely fill the contact opening. Hence, a dielectric layer can be deposited to fill the space between the metal oxide structure's sidewalls and the sidewalls of the contact opening, and enclose the sacrificial metal oxide. In other words, the deposited dielectric layer creates a mold around the sacrificial metal oxide structure. The sacrificial metal oxide structure can then be removed to leave behind a "void" in the dielectric layer. The "void" is smaller than the original contact opening and is substantially aligned to the underlying metal contact. In the formed "void" a new contact metal can be deposited. The new metal contact can be aligned to the underlying metal contact without the need for photolithography alignment.

The present disclosure is directed to the formation of self-aligned contacts, vias, and structures that minimize or remove contact misalignment. By way of example and not limitation, the self-aligned contacts can be applied to different types of transistor structures such as, for example, multiple-gate field-effect transistors (MuGFETs) (e.g., double-gate FinFETs and triple-gate FinFETs), horizontal gate-all-around transistors, and planar transistors.

FIG. 1 is an isometric view of a metal region 100 surrounded laterally by a dielectric layer 110, according to some embodiments. By way of example and not limitation, metal region 100 can be a part of an interconnect (e.g., a contact line or a via) or part of a metal gate electrode. In some embodiments, metal region 100 includes tungsten (W), cobalt (Co), titanium (Ti), ruthenium (Ru), copper (Cu), any other suitable metal or alloy, or any combination thereof. By way of example and not limitation, the aforementioned materials can be deposited using chemical vapor deposition (CVD), plasma enhanced CVD (PECVD), atomic layer deposition (ALD), plasma enhanced ALD (PEALD), physical vapor deposition (PVD), electroplating, or any other suitable deposition process. They can also be deposited with a deposition-etch method or a deposition-etch-deposition method. In some embodiments, dielectric layer 110 includes a silicon dioxide ($SiO_2$), carbon-incorporated silicon oxide (SiOC), silicon oxynitride (SiON), silicon nitride ($Si_3N_4$ or SiN), silicon-oxy-carbon nitride (SiOCN), silicon carbide (SiC), or silicon carbon nitride (SiCN). However, dielectric layer 110 may not be limited to the materials mentioned above. By way of example and not limitation, the aforementioned materials can be deposited using CVD, PECVD, ALD, PEALD, high-density plasma (HDP), flowable CVD, high aspect ratio process (HARP), a spin-on coating process, or any other suitable deposition process.

Figure 2:
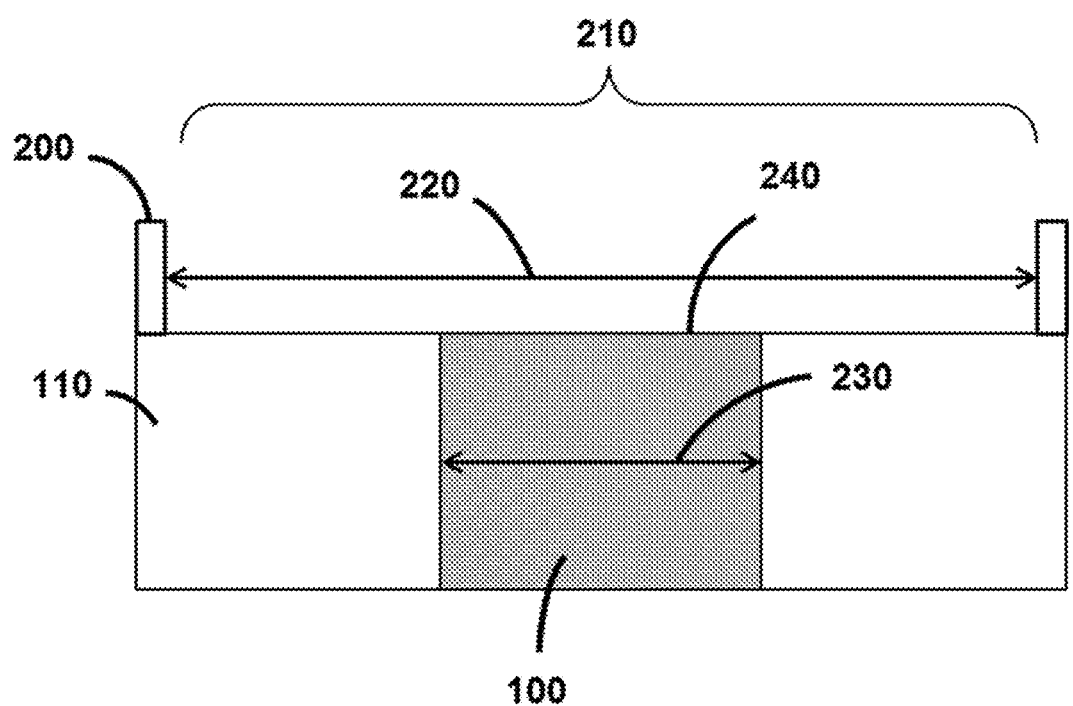
FIGS. 2-8 show cross-sectional views of a partially fabricated replacement contact after a series of processing steps, according to some embodiments.

FIG. 2 is a cross-sectional view along plane 120 of FIG. 1. A dielectric layer 200 is deposited over dielectric layer 110 and metal region 100. In some embodiments, dielectric layer 200 can be an insulator such as $SiO_2$ or $Si_3N_4$ and can be patterned using photolithography and etch processes. For example, a coat of photoresist can be applied on dielectric layer 200. The photoresist is then exposed and developed according to a desired pattern; for example, a desired pattern could be openings to expose at least a portion of metal region 100 and neighboring portions of dielectric layer 110.

The unexposed areas of the photoresist can be stripped with a wet clean, leaving behind the desired pattern of developed photoresist on dielectric layer 200. A dry etch process can be used, for example, to remove exposed areas of dielectric layer 200. Areas of dielectric layer 200 covered by the developed photoresist can be protected from the etch chemistry of the dry etch process and therefore not etched. Once the exposed areas of dielectric layer 200 are etched away, the remaining developed photoresist can be stripped with a wet clean. The result of this process is etched portions, or openings, in dielectric layer 200; like an opening 210 shown in FIG. 2. The etch process that removes dielectric layer 200 can be end-pointed: e.g., the etch process is terminated when metal region 100 is exposed. End-point detection is based on the etch rate differences between dielectric layer 200 and metal region 100 for a given etch chemistry. An abrupt change in etch rate and etched species is detected by in-situ metrology equipment such as, for example, an optical emission spectroscope. The optical emission spectroscope can be integrated into the etch chamber for real-time monitoring of the etch process.

In some embodiments, as shown in FIG. 2, the photolithography process defines opening 210 that exposes metal region 100 and portions of adjacent dielectric layer 110. Opening 210 has a width 220, which is larger than a width 230 of metal region 100. By forming opening 210 larger than width 230, the photolithography process can be relaxed and is not required to create an opening to match width 230 of metal region 100. Thus, overlay issues for small CD features (e.g., width 230 of metal region 100) can be minimized or eliminated.

In some embodiments, a metal oxide structure (e.g., a sacrificial contact material or replaceable contact) is selectively grown on metal region 100 using an area-selective ALD (AS-ALD) process or an area-selective CVD (AS-CVD) process. In such processes, as would be understood by a person of ordinary skill in the art, the metal oxide structure grows on an exposed metal region area 240 of opening 210; but not on adjacent exposed areas of dielectric layer 110 or the sidewall areas of dielectric layer 200. In area-selective processes, the deposition selectivity can be achieved by reactants, such as the precursor and the reactive gas or gasses, exhibiting different adsorption behavior depending on a deposition surface and process conditions. For example, the precursor molecules may adsorb faster on a metallic surface than on a dielectric surface for a given process condition; and therefore a metal oxide can start growing immediately on a metallic surface, whereas the nucleation on a dielectric surface can be retarded. The precursor selection, as well as the process conditions (e.g., the type of reaction gases, partial pressures of the precursor and reactant gases, and the deposition temperature) can be tailored to achieve the desired deposition selectivity.

Figure 3:
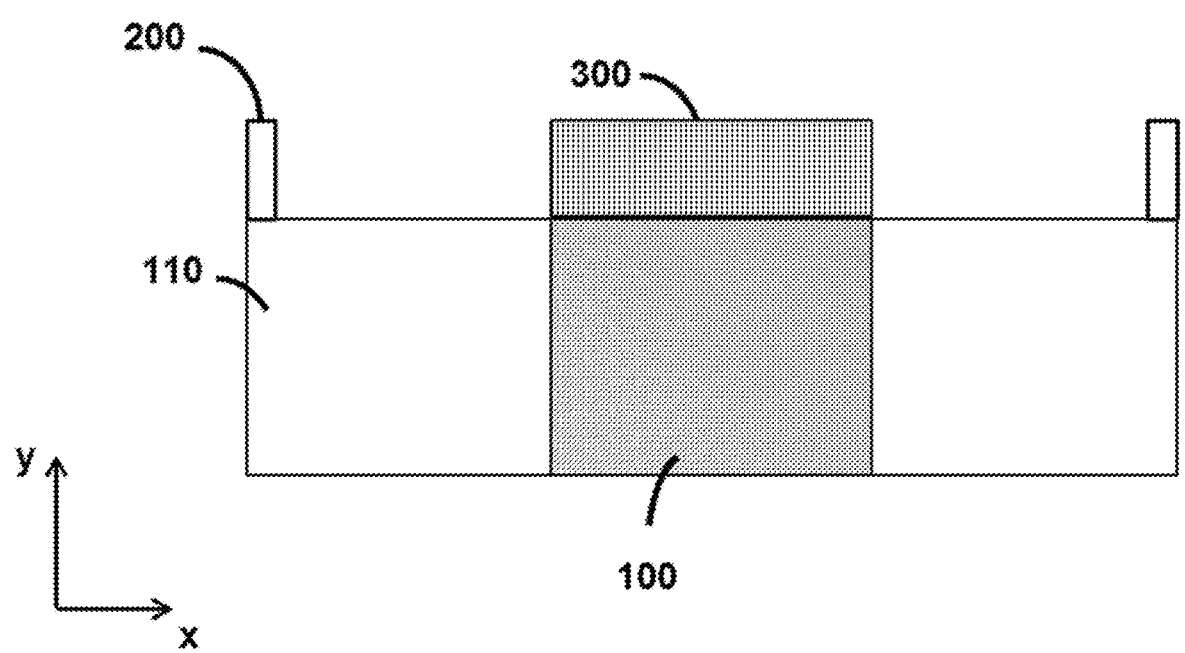

FIG. 3 shows a metal oxide structure 300 grown using an area selective process such as AS-ALD or AS-CVD. By way of example and not limitation, the metal oxide structure can include hafnium oxide ($HfO_2$), zirconium oxide ($ZrO_2$), aluminum oxide ($Al_2O_3$), cerium oxide ($CeO_2$), titanium oxide ($TiO_2$), or aluminum oxynitride (AlON). Metal oxide structure 300 is grown from bottom-up and has vertical (or substantially vertical) sidewalls—e.g., the sidewalls are grown towards the y-direction.

However, selective deposition of metal oxide structure 300 on exposed metal surface 240 may not be possible with AS-ALD or AS-CVD. For example, suitable precursors, reactive gasses, or process conditions to promote selective growth can be absent on a desired surface. In these cases, selective deposition can be possible with the use of a self-assembled monolayer (SAM) process, which can inhibit metal oxide growth on dielectric surfaces according to some embodiments. As would be understood by a person of ordinary skill in the art, the SAM would nucleate on the surfaces of layer 200 and dielectric layer 110 and not on exposed metal surface 240. However, if the SAM nucleation occurs on exposed metal region 240, it can be removed either with an oxygen plasma ashing, a sulfuric-peroxide (SPM) ($H_2SO_4/H_2O_2$) wet clean, or a high-temperature anneal (e.g., >300° C.). Examples of SAM are alkylsilane and octadecyltrichlorosilane ($CH_3(CH_2)_{17}SiCl_3$) (OTS). OTS can be used to react with hydroxide "—OH" groups on $SiO_2$ dielectric surfaces to form a self-assembled siloxane monolayer.

After the SAM nucleation, the metal oxide structure can be grown with CVD or ALD methods. For example CVD, PECVD, ALD, or PEALD. By way of example and not limitation, the metal oxide structure can include $HfO_2$, $ZrO_2$, $Al_2O_3$, $CeO_2$, $TiO_2$, or AlON. Metal oxide structure 300 is grown from bottom-up and has vertical (or substantially vertical) sidewalls—e.g., the sidewalls are grown towards the y-direction.

Once the formation of metal oxide structure 300 has been completed, the SAM can be removed from the dielectric surfaces with either oxygen plasma ashing or an SPM wet clean.

Figure 4:
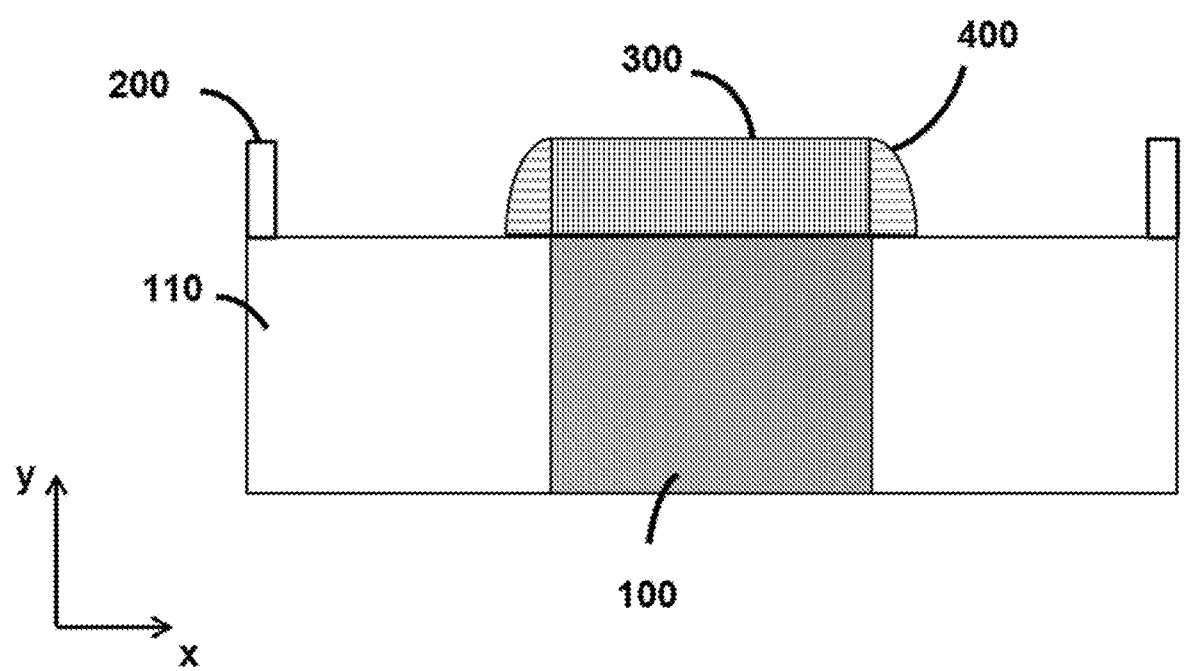

After the formation of metal oxide structure 300, an optional operation can be introduced to form spacers 400 on the sidewalls of metal oxide structure 300 as shown in FIG. 4. A purpose of the dielectric spacer, among others, is to protect dielectric layer 110 from etch damage in the subsequent replacement of the sacrificial metal oxide structure 300. In some embodiments, optional dielectric spacers 400 can be a stack of a more than one spacer. In some embodiments, spacers 400 are made of SiOC, SiON, $Si_3N_4$ or SiN, SiOCN, SiC, or SiCN. By way of example and not limitation, spacers 400 can be deposited with chemical vapor-based deposition processes like PECVD, HDP, ALD, or a spin-on coating process. By way of example and not limitation, formation of spacers 400 can start with a blanket spacer layer deposited over the metal oxide structure 300 and its sidewalls, exposed surfaces of dielectric layer 110, and the surfaces of layer 200. A directional etchback process, such as for example a RIE process and/or other suitable processes, can be used to selectively remove the blanket spacer layer from any horizontal surfaces besides the sidewalls of metal oxide structure 300. This selective removal can be accomplished if the etch rate is preferentially high in the y-direction (e.g., anisotropic etch). In some embodiments, each spacer 400 can have a width in a range from about 5 nm to about 10 nm. However. thicker or thinner spacers could be possible. A person of ordinary skill in the art will recognize that spacers 400 could include a single layer or multiple layers of the same or different materials.

Figure 5:
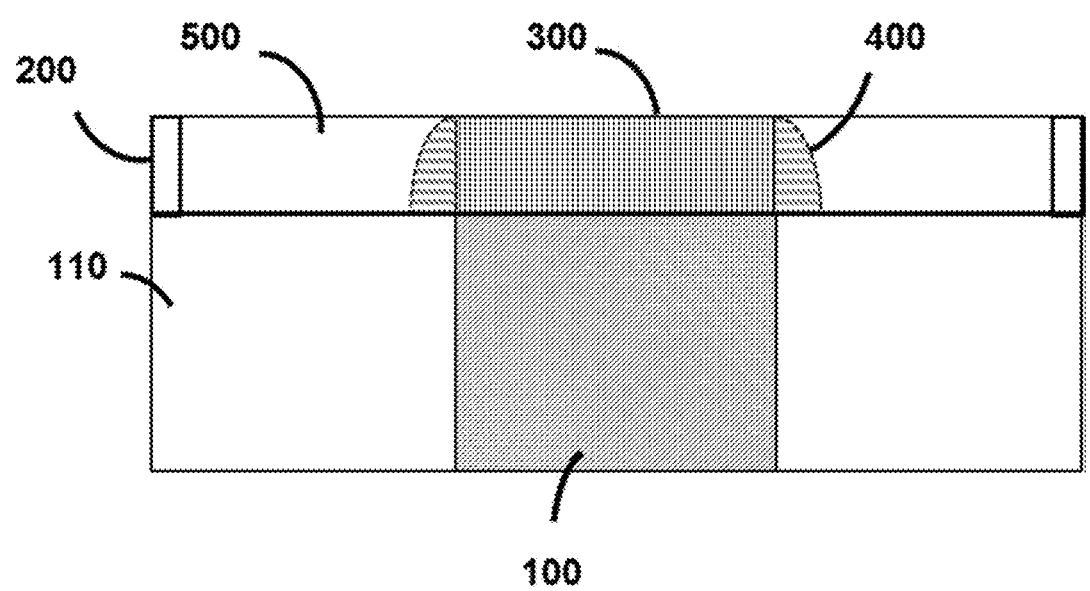

In FIG. 5 an inter-layer dielectric (ILD) or dielectric layer 500 is formed adjacent to metal oxide structure 300 or optional dielectric spacers 400. In some embodiments, dielectric layer 500 can be an insulating material, including silicon oxide, SiOC, SiON, SiN, SiOCN, SiC, or SiCN film, that surrounds metal oxide structure 300. By example and not limitation, dielectric layer 500 can be formed by CVD, ALD, HDP, flowable CVD, HARP, spin-on coating processes, or any other suitable deposition process.

In some embodiments, a chemical-mechanical planarization (CMP) process can be used to remove portions of dielectric layer 500 so that the top surfaces of dielectric layer 500 and metal oxide structure 300 are aligned. If dielectric layer 500 is, for example, $SiO_2$, the CMP process can use a $CeO_2$-based slurry with abrasive concentration of 0.1 to 1% and pH of 4 to 6 for optimized polishing selectivity. Alternatively, an etch-back process can be used to remove portions of dielectric layer 500.

Figure 6:
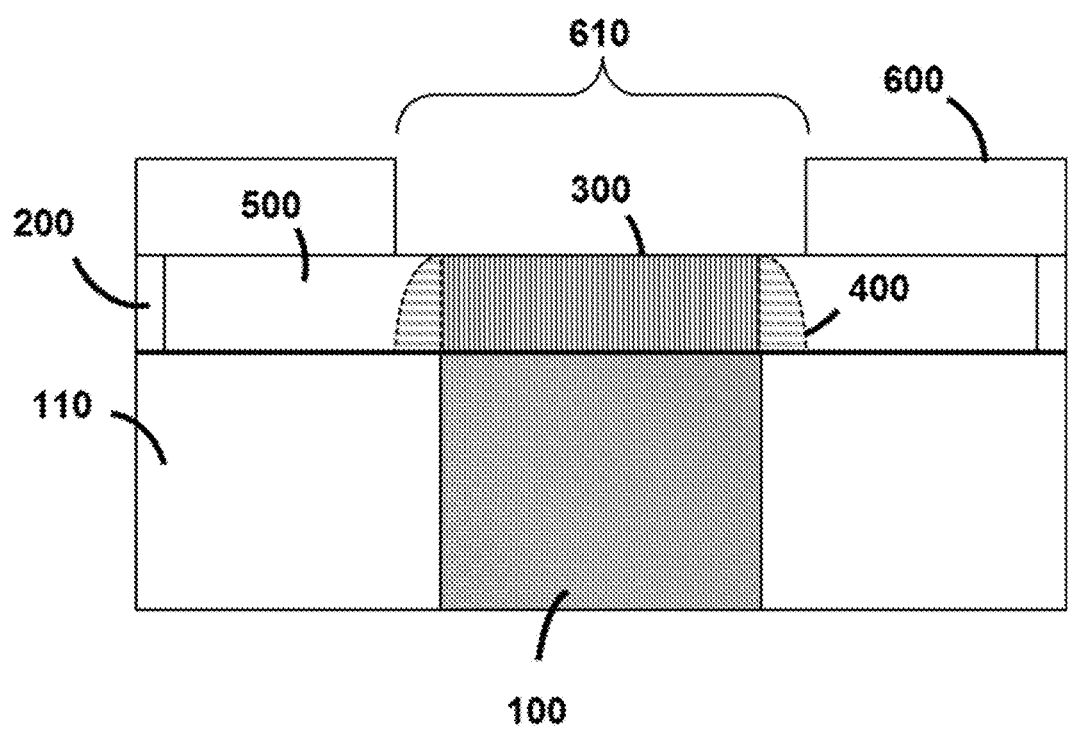

In FIG. 6, an optional patterning layer 600 is deposited over oxide structure 300 and dielectric layer 500, according to some embodiments. An opening 610 can be formed in patterning layer 600 using photolithography and etching operations similar to the ones used in FIG. 2 to form opening 210 in dielectric 200. Opening 610 exposes metal oxide structure 300. In some embodiments, layer 600 can be a photoresist soft mask (SM) or a hard mask (HM) dielectric (e.g., SiN, SiOC, SiON, SiOCN, SiC, or SiCN film). By way of example and not limitation, if layer 600 is a SM, it can be removed in subsequent processing steps.

In some embodiments, a wet etch or dry etch process can be used to selectively remove metal oxide structure 300 without etching the underlying metal region 100. In some embodiments, the wet or dry etch selectivity between the metal oxide and the metal, or the metal oxide and the dielectric, can be greater than 2 to 1 (e.g., greater than 10 to 1). Exemplary wet etch chemistries that can provide 10 to 1 selectivity between, for example $HfO_2$ and $SiO_2$, are diluted hydrofluoric acid (HF) solution with dilution ratio greater than 1000 to 1 or an isopropyl alcohol (IPA)/HF solution. An exemplary dry etch chemistry that can selectively remove metal oxides, such as $ZrO_2$, is boron chloride. These etching chemicals are merely examples and are not intended to be limiting.

In some embodiments, the dry etch process can be a reactive ion etching (ME), an inductively coupled plasma RIE (ICP-RIE), or any other chemical etching process with a plasma chemistry that has appropriate selectivity (e.g., greater than 2 to 1 or greater than 10 to 1). In some embodiments, the dry etch process can be timed, end-pointed, or a combination of timed and end-pointed. For example, the dry etch process can be timed for a portion of the etch and end-pointed towards the end of the etch. End-point detection is based on the etch rate differences between metal oxide layer 300 and metal region 100 for a given etch chemistry. An abrupt change in etch rate and etched species is detected by in-situ metrology equipment such as, for example, an optical emission spectroscope. The optical emission spectroscope can be integrated into the etch chamber for real-time monitoring of the etch process.

Figure 7:
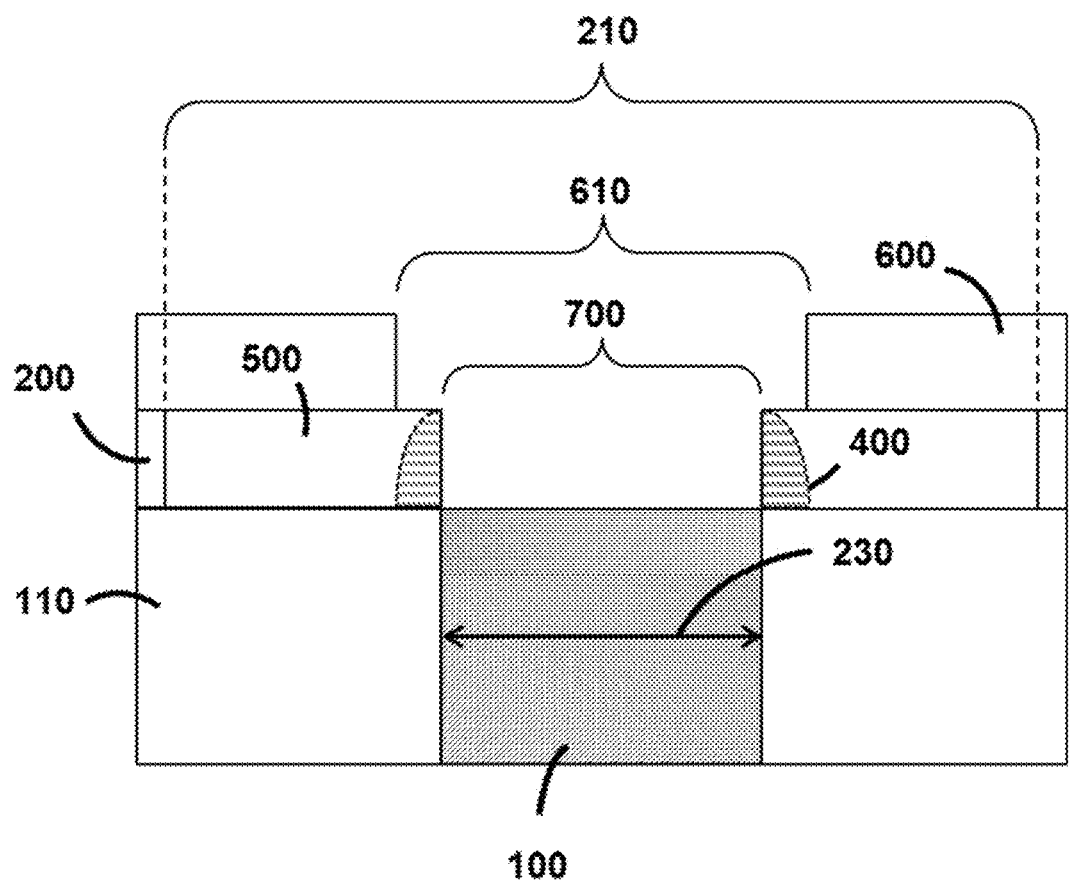

Referring to FIG. 7, once metal oxide structure 300 is selectively removed, an opening 700 is formed in dielectric layer 500 or between optional spacers 400. As such, opening 700 is self-aligned to metal region 100 and shares the same or substantially the same width dimension with width 230. In addition, opening 700 is smaller than opening 210, which was defined earlier by photolithography.

Figure 8:
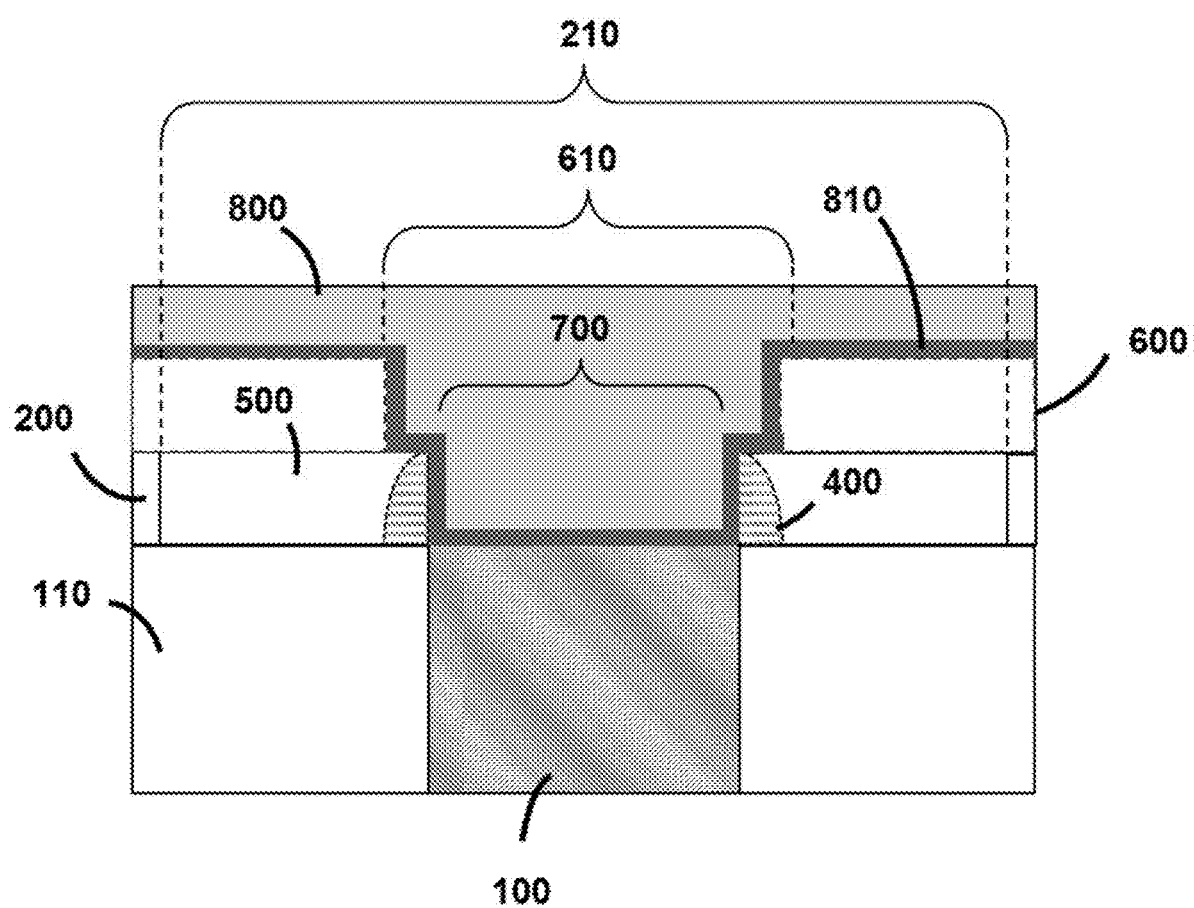

Referring to FIG. 8, a metal 800 is deposited to fill openings 610 and 700. Metal 800 can be deposited with a suitable blanket deposition such as, for example, ALD or PEALD, CVD or PECVD, PVD, or electroplating. In some embodiments, metal 800 can be a contact or a via. Prior to depositing metal 800, a stack 810 that can include two or more layers is deposited in opening 610 to cover the exposed dielectric 500, 600 and metal 100 surfaces, according to some embodiments. Stack 810 can also be deposited with similar deposition methods such as, for example, ALD or PEALD, CVD or PECVD, PVD, or electroplating. Stack 810 can have a dual purpose such as, for example, it can act as an adhesion layer and a barrier layer for metal 800. In some embodiments, the layers in stack 810 can be different depending on the type of metal 800. For instance, if metal 800 is W or Co, then stack 810 can be Ti and titanium nitride (TiN); if metal 800 is Cu, then stack 810 can be tantalum nitride (TaN) and tantalum (Ta).

Figure 9:
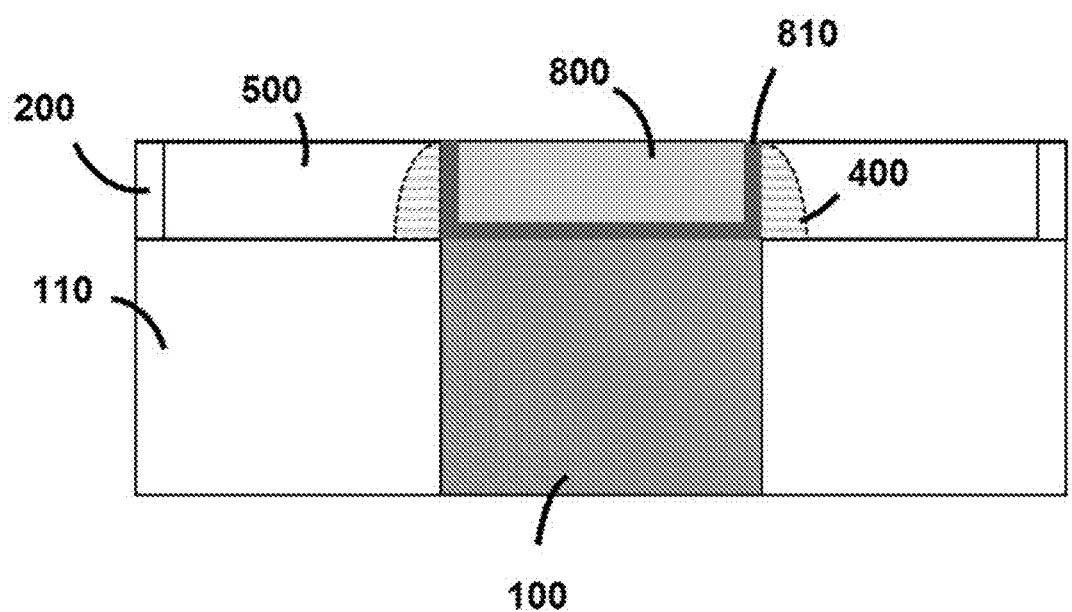
FIG. 9 is a cross-sectional view of a replacement contact structure, according to some embodiments.

In some embodiments, a CMP process can be used to remove portions of metal 800 so that the top surfaces of the dielectric layer 500, metal 800, and stack 810 are aligned as shown in FIG. 9. In some embodiments, the CMP process, can use a silicon or an aluminum abrasive with abrasive concentrations between 0.1% and 3%, and pH<7 for W metal and pH>7 for Co and Cu metals. Alternatively, an etch-back process can be used to remove portions of metal 800.

Figure 10:
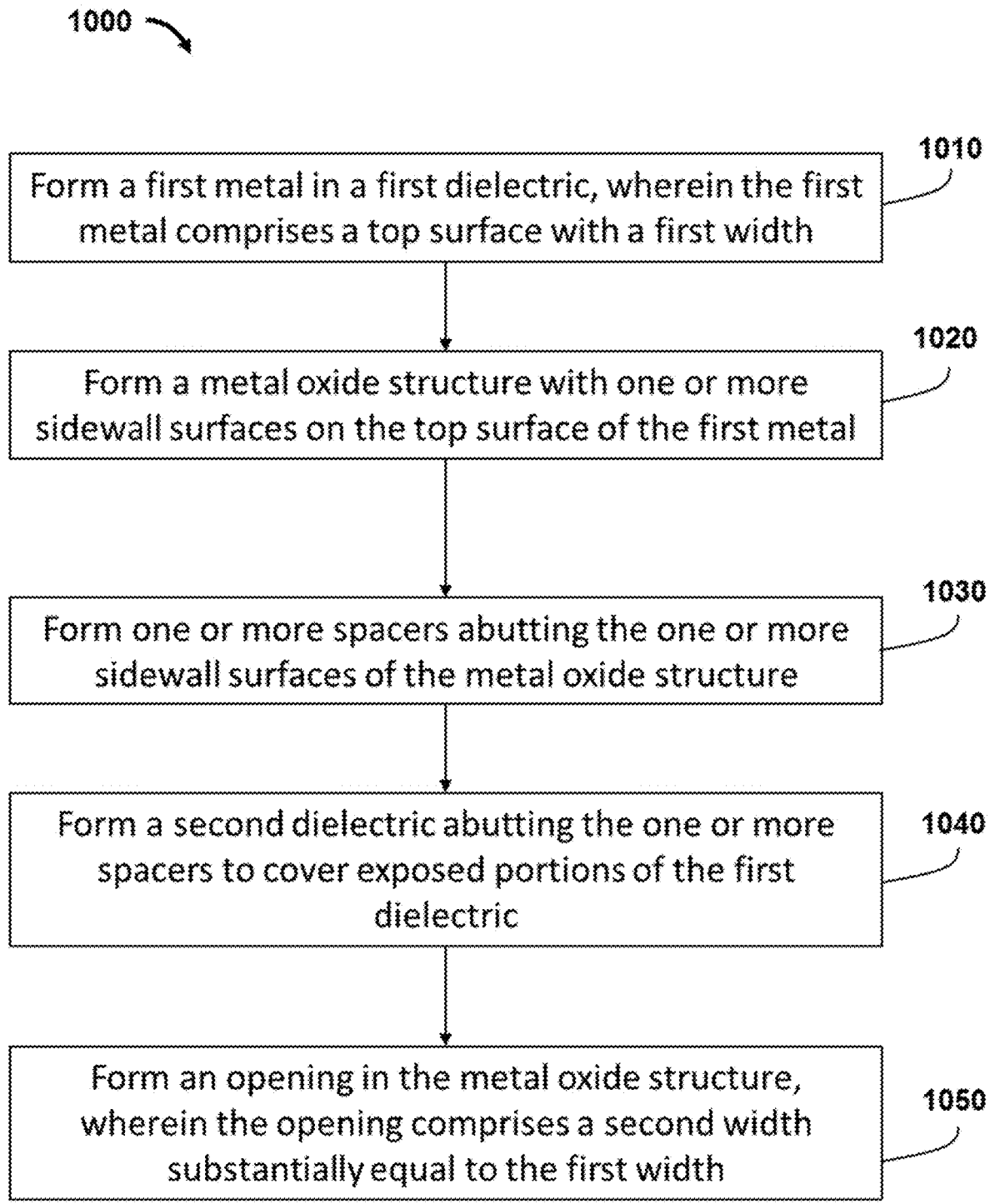
FIG. 10 is a flow chart of an exemplary fabrication method of replacement contacts, according to some embodiments.

FIG. 10 is a flow chart of an exemplary replacement contact fabrication process 1000, according to some embodiments. Fabrication process 1000 is not limited to the example provided herein. A person of ordinary skill in the art will recognize that more or less operations than those shown in fabrication process 1000 can be performed. A person of ordinary skill in the art will also recognize that the order of the operations shown in fabrication process 1000 can vary.

The exemplary replacement contact fabrication process 1000 starts with operation 1010 and a first metal formation in a first dielectric. The first metal includes a top surface with a first width. By way of example and not limitation, the first metal can be a metal region such as, for example, metal region 100 of FIG. 1, and the first dielectric can be dielectric layer 110 of FIG. 1. In some embodiments, the first metal can be a part of an interconnect (e.g., a contact line or a via) or part of a metal gate electrode made of W, Co, Ti, Ru, Cu, any other suitable metal or alloy, or a combination of thereof. In some embodiments, first metal can be deposited with CVD-based or ALD-based processes, PVD-based processes, or electroplating. By way of example and not limitation, the first dielectric, such as dielectric layer 110, can be $SiO_2$, SiOC, SiON, silicon nitride, SiOCN, SiC, or SiCN films deposited using CVD, ALD, HDP, flowable CVD, HARP, spin-on coating processes, or any other suitable deposition process. A person of ordinary skill in the art should appreciate that these are merely examples and additional deposition techniques can be used to form the first dielectric.

In operation 1020, and referring to FIG. 3, a metal oxide structure (e.g., a sacrificial contact material) is formed by selective growth on metal region 100 (first metal) using, by way of example and not limitation, an AS-ALD process or an AS-CVD process. In such processes, as would be understood by a person of ordinary skill in the art, the metal oxide structure grows on an exposed metal region area 240 of opening 210; but not on adjacent exposed areas of dielectric layer 110 or the sidewall areas of dielectric layer 200. In area-selective processes, the deposition selectivity can be achieved by the reactants, such as the precursor and the reactive gas or gasses, exhibiting different adsorption behavior depending on a deposition surface and process conditions. For example, the precursor molecules may adsorb faster on a metallic surface than on a dielectric surface for a given process condition; and therefore a metal oxide can start growing immediately on a metallic surface, whereas the nucleation on a dielectric surface can be retarded. The precursor selection, as well as the process conditions (e.g., the type of reaction gases, partial pressures of the precursor and reactant gases, and the deposition temperature) can be tailored to achieve the desired deposition selectivity.

In some embodiments, the metal oxide structure can include $HfO_2$, $ZrO_2$, $Al_2O_3$, $CeO_2$, $TiO_2$, or AlON. Metal oxide structure 300 grows from bottom-up and has vertical (or substantially vertical) sidewalls—e.g., the sidewalls are grown towards the y-direction.

In the event that selective growth of a metal oxide is not possible, a surface treatment with a SAM can induce the selective growth of a metal oxide. In some embodiments, a SAM process can inhibit the metal oxide growth on dielectric surfaces. As would be understood by a person of ordinary skill in the art, the SAM would nucleate on the exposed surfaces of dielectric layer 200 and dielectric layer 110 and not on exposed metal surface 240. However, if SAM nucleation occurs on exposed metal region 240, it can be removed either with an oxygen plasma ashing, an SPM wet clean, or a high-temperature anneal (e.g., >300° C.). Examples of SAM are alkylsilane and octadecyltrichlorosilane. Octadecyltrichlorosilane can be used to react with "—OH" groups on $SiO_2$ dielectric surfaces to form a self-assembled siloxane monolayer.

In operation 1030, an optional operation can be introduced to form one or more spacers on the sidewalls of the metal oxide structure like exemplary spacers 400 of FIG. 4. In some embodiments, the spacers can be SiOC, SiON, $Si_3N_4$ or SiN, SiOCN, SiC, or SiCN films deposited with CVD-based processes such as PECVD, HDP-CVD, ALD, or a spin-on coating process. To form spacers 400, a blanket spacer layer is first deposited over the metal oxide structure 300 and its sidewalls, exposed surfaces of dielectric layer 110, and the surfaces of HM layer 200. A directional etch-back process, such as for example a RIE processes and/or other suitable processes, can be used to selectively remove the blanket spacer layer from all the surfaces besides the sidewalls of metal oxide structure 300. This selective removal can be accomplished if the etch rate is preferentially higher in the y-direction than in the x-direction (anisotropic etch). In some embodiments, each spacer 400 can have a width in a range from about 5 nm to about 10 nm. A person of ordinary skill in the art will recognize that spacers 400 could include of a single or multiple layers of the same or different materials.

In operation 1040, a second dielectric is formed adjacent to the sidewall surfaces of the metal oxide structure or adjacent to the optional spacers of the metal oxide structure. An exemplary second dielectric is dielectric layer 500 of FIG. 5. In some embodiments, dielectric layer 500 can be an insulating material, such as SiO2, SiOC, SiON, SiN, SiOCN, SiC, or SiCN. Dielectric layer 500 surrounds metal oxide structure 300. By way of example and not limitation, the dielectric layer 500 can be formed using PECVD, PEALD, HDP, etc., or a spin-on coating process. In some embodiments, a CMP process can be used to remove portions of dielectric layer 500 so that the top surfaces of the dielectric layer 500 and metal oxide 300 are aligned. This process is known as planarization. Alternatively, an etch-back process can be used to remove portions of dielectric layer 500.

An optional patterning layer can be deposited over oxide structure 300 and dielectric layer 500, according to some embodiments. Referring to FIG. 6, a patterning layer 600 is deposited and an opening 610 is formed therein using photolithography and etching operations similar to the ones used to create the opening in dielectric layer 500. Opening 610 exposes metal oxide structure 300. In some embodiments, layer 600 can be a photoresist soft mask (SM) or a hard mask dielectric (e.g., SiN, SiOC, SiON, SiOCN, SiC, or SiCN film). By way of example and not limitation, if layer 600 is a SM, it can be removed in subsequent processing steps.

In operation 1050, a wet etch or dry etch process can be used to selectively remove metal oxide structure 300 without etching the underlying metal region 100. Therefore, forming an opening in the metal oxide structure. The formed opening has a width that is substantially equal to the width of the first metal's top surface. The wet or dry etch selectivity between the metal oxide and the metal, or between the metal oxide and the dielectric, can be greater than 2 to 1 (e.g., greater than 10 to 1). Exemplary wet etch chemistries that can provide 10 to 1 selectivity between, for example $HfO_2$ and $SiO_2$, are diluted hydrofluoric acid solution with dilution ratio greater than 1000 to 1, or an isopropyl alcohol/HF solution. An exemplary dry etch process that can selectively remove metal oxides, such as $ZrO_2$, is boron chloride. These are examples and are not intended to be limiting. By way of example and not limitation, the dry etch process can be a RIE, an ICP-RIE, or any other chemical etch with selectivity greater than 2 to 1 or greater than 10 to 1. Referring to FIG. 7, once metal oxide structure 300 is removed, an opening 700 is formed in dielectric layer 500 or between optional spacers 400. As such, opening 700 is self-aligned to metal region 100 and shares the same or substantially the same width dimension as width 230. In addition, opening 700 is smaller than opening 210, which was previously defined by photolithography.

Referring to FIG. 8, a metal 800 is deposited to fill openings 610 and 700. For this reason, metal 800 is deposited with a suitable blanket deposition such as, for example, ALD or PEALD, CVD or PECVD, PVD, electroplating, etc. In some embodiments, metal 800 is a via, or a contact. Prior to metal 800 deposition, a stack 810 that can include two or more layers is deposited in opening 210 to cover the exposed dielectric 500, 600 and metal 100 surfaces. Stack 810 can also be deposited with similar deposition methods such as, for example, ALD or PEALD, CVD or PECVD, or PVD. Stack 810 can have a dual purpose such as, for example, it can act as an adhesion layer and a barrier layer for metal 800. In some embodiments, the layers in stack 810 can be a Ti/TiN for W or Co metal, and a TaN/Ta for Cu metal. In some embodiments, a CMP process can be used to remove portions of metal 800 so that the top surfaces of the dielectric layer 500, the metal 800 and stack 810 are aligned as shown in FIG. 9. In some embodiments, the CMP process can use a silicon or an aluminum abrasive with 0.1% to 3% abrasive concentrations, and pH<7 for W CMP and pH>7 for Co and Cu. Alternatively, an etch-back process can be used for the planarization.

Photolithography overlay errors may lead to contact-to-contact misalignment, which in turn is responsible for increased contact resistance and chip performance degradation. The present disclosure is directed to the formation of self-aligned contacts using a sacrificial metal oxide structure (replacement contact) to minimize or eliminate contact misalignment. In some embodiments, the additional contact margin can be derived from the formation of a larger contact opening positioned above a sacrificial metal oxide structure which is self-aligned to a smaller underlying contact opening. By way of example and not limitation, the self-aligned contacts can be applied to multiple-gate field-effect transistors (MuGFETs), including double-gate FinFETs, triple-gate FinFETs, horizontal gate-all-around transistors, and planar transistors.

In some embodiments, a method of forming a replacement contact includes a first metal with a top surface is formed in a first dielectric. The top surface of the first metal has a first width. A metal oxide structure with one or more sidewall surfaces is formed on the top surface of the first metal. One or more spacers are formed to abut the one or more sidewall surfaces of the metal oxide structure. Further, a second dielectric, which covers the exposed portions of the first dielectric, is formed to abut the one or more spacers. An opening with a second width is formed in the metal oxide structure. The openings second width is substantially equal to the first width of the first metal.

In some embodiments, a method of forming a replacement contact includes a first metal with an exposed top surface, formed in a first dielectric. The exposed top surface has a first width. A self-assembled monolayer with a first opening over the top surface of the first metal, is formed over the first dielectric. A metal oxide structure that includes one or more first sidewall surfaces, is formed in the first opening. The self-assembled monolayer is removed and one or more spacers are formed to abut the one or more first sidewall surfaces of the metal oxide structure. A second dielectric is formed to abut the one or more spacers. Further, the second dielectric covers the exposed portions of the first dielectric. The metal oxide structure is removed to create a second opening with a second width. The second width is substantially equal to the first width of the first metal.

In some embodiment, a structure includes a first metal which has first sidewall surfaces and a top surface with a first width. A first dielectric is abutting the first sidewall surfaces, and a second dielectric is disposed over the first dielectric. The second dielectric includes an opening that has second sidewall surfaces which are substantially aligned to the first sidewall surfaces of the first metal.

The foregoing outlines features of embodiments so that a person of ordinary skill in the art may better understand the aspects of the present disclosure. A person of ordinary skill in the art should appreciate that they may readily use the present disclosure as a basis for designing or modifying other processes and structures for carrying out the same purposes and/or achieving the same advantages of the embodiments introduced herein. A person of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A conductive structure, comprising:
  a first conductive structure surrounded by a first dielectric, wherein the first conductive structure has a first width;
  a second dielectric formed over the first dielectric;
  a pair of spacers embedded in the second dielectric and spaced apart; and
  a second conductive structure embedded in the second dielectric and formed on a top surface of the first conductive structure, wherein each spacer of the pair of spacers is interposed between a sidewall of the second conductive structure and the second dielectric.

2. The conductive structure of claim 1, wherein an edge of each spacer abutting the sidewall of the second conductive structure is aligned to a corresponding sidewall edge of the first conductive structure.

3. The conductive structure of claim 1, wherein the top surface of the first conductive structure and a top surface of the first dielectric are coplanar.

4. The conductive structure of claim 1, wherein each spacer of the pair of spacers comprises carbon-incorporated silicon oxide (SiOC), silicon oxynitride (SiON), silicon nitride ($Si_3N_4$ or SiN), silicon-oxy-carbon nitride (SiOCN), silicon carbide (SiC), or silicon carbon nitride (SiCN).

5. The conductive structure of claim 1, wherein sidewall edges of the first conductive structure are aligned to sidewall edges of the second conductive structure.

6. The conductive structure of claim 1, wherein the second conductive structure comprises:
   a conductive material; and
   a liner stack interposed between the conductive material and the first conductive structure and between the conductive material and each spacer.

7. The conductive structure of claim 1, wherein the first and second conductive structures are vertical interconnect access lines (vias).

8. A conductive structure, comprising:
   a first conductive structure surrounded by a first dielectric;
   a second conductive structure formed on the first conductive structure, wherein sidewall edges of the first conductive structure are aligned to sidewall edges of the second conductive structure;
   a spacer on each sidewall of the second conductive structure, wherein the spacer does not overlap with the first conductive structure; and
   a second dielectric disposed on the first dielectric layer abutting the spacer.

9. The conductive structure of claim 8, wherein the second dielectric does not overlap with the first conductive structure.

10. The conductive structure of claim 8, wherein the first and second conductive structures have equal widths.

11. The conductive structure of claim 8, wherein the first and second conductive structures are in physical contact and form an interconnect structure.

12. The conductive structure of claim 8, wherein a conductive material of the first conductive structure is different from a conductive material of the second conductive structure.

13. The conductive structure of claim 8, wherein the first and second conductive structures comprise the same conductive material.

14. A conductive structure, comprising:
   a first conductive structure surrounded by a first dielectric;
   a second conductive structure comprising a bottom portion and a top portion wider than the bottom portion, wherein the bottom portion is in physical contact with the first conductive structure and has a width equal to that of the first conductive structure; and
   a second dielectric disposed on the first dielectric surrounding sidewalls of the second conductive structure.

15. The conductive structure of claim 14, wherein sidewall edges of the bottom portion of the second conductive structure are aligned to sidewall edges of the first conductive structure.

16. The conductive structure of claim 14, wherein the second conductive structure comprises a conductive material surrounded by a liner, and wherein the liner is interposed between the conductive material and the first conductive structure and between the conductive material and the second dielectric.

17. The conductive structure of claim 14, wherein the second dielectric comprises a bottom portion surrounding the bottom portion of the second conductive structure and a top portion surrounding the top portion of the second conductive structure.

18. The conductive structure of claim 17, further comprising a spacer interposed between each sidewall of the bottom portion of the second conductive structure and the bottom portion of the second dielectric.

19. The conductive structure of claim 14, wherein the bottom portion of the second conductive structure forms a vertical interconnect access line (via) and the top portion of the second conductive structure comprises a line.

20. The conductive structure of claim 14, wherein a conductive material of the first conductive structure is different from a conductive material of the second conductive structure.

* * * * *